United States Patent [19]
Pelley, III et al.

[11] Patent Number: 5,502,676
[45] Date of Patent: Mar. 26, 1996

[54] INTEGRATED CIRCUIT MEMORY WITH COLUMN REDUNDANCY HAVING SHARED READ GLOBAL DATA LINES

[75] Inventors: Perry H. Pelley, III; Hamed Ghassemi, both of Austin, Tex.

[73] Assignee: Motorola, Inc., Schaumburg, Ill.

[21] Appl. No.: 426,994

[22] Filed: Apr. 24, 1995

[51] Int. Cl.$^6$ .................................................. G11C 7/00
[52] U.S. Cl. ........................ 365/200; 365/177; 365/225.6
[58] Field of Search ............................. 365/200, 189.02, 365/177, 225.6, 230.03; 371/10.3

[56] References Cited

U.S. PATENT DOCUMENTS

| | | | |
|---|---|---|---|
| 4,837,747 | 6/1989 | Dosaka | 365/200 X |
| 4,881,200 | 11/1989 | Urai | 365/200 X |
| 5,163,023 | 11/1992 | Ferris | 365/200 |
| 5,293,348 | 3/1994 | Abe | 365/230.03 |

Primary Examiner—David C. Nelms
Assistant Examiner—Son Mai
Attorney, Agent, or Firm—Daniel D. Hill

[57] ABSTRACT

An integrated circuit memory (30) having redundancy shares read, global data lines shared between a regular memory array (35) and a plurality of redundant columns (41). Redundant data and regular data are multiplexed onto the read global data lines by emitter summing bipolar transistors of regular sense amplifiers (46) with a redundant multiplexer (83). When a redundant column is used to replace a defective regular column, a match circuit (88) generates a match signal for selecting a redundant multiplexer circuit (84, 85, or 86) and for deselecting a corresponding regular sense amplifier (46). The match circuit (88) includes emitter summing circuits (230, 240) to rapidly generate the match signal.

22 Claims, 6 Drawing Sheets

INTEGRATED CIRCUIT MEMORY WITH COLUMN REDUNDANCY HAVING SHARED READ GLOBAL DATA LINES

CROSS-REFERENCE TO RELATED, COPENDING APPLICATION

A related, copending application is entitled "Address Comparison In An Integrated Circuit Memory", by Hamed Ghassemi et al., attorney docket number SC02765A, assigned to the assignee hereof, and filed concurrently herewith.

FIELD OF THE INVENTION

This invention relates generally to integrated circuit memories, and more particularly, to an integrated circuit memory with column redundancy having shared read global data lines.

BACKGROUND OF THE INVENTION

Integrated circuit memories are being manufactured having increased storage capacity with reduced minimum feature size. As the storage capacity of an integrated circuit memory increases, and/or the minimum feature size decreases, the possibility of having manufacturing defects in the integrated circuit memory increases, reducing production yields. Redundancy is used to repair defective memory cells in an integrated circuit memory by replacing a defective row or column with a redundant row or redundant column, respectively. The ability to repair a memory that has only a few defective rows or columns can result in substantially increased manufacturing yields.

Figure 1:
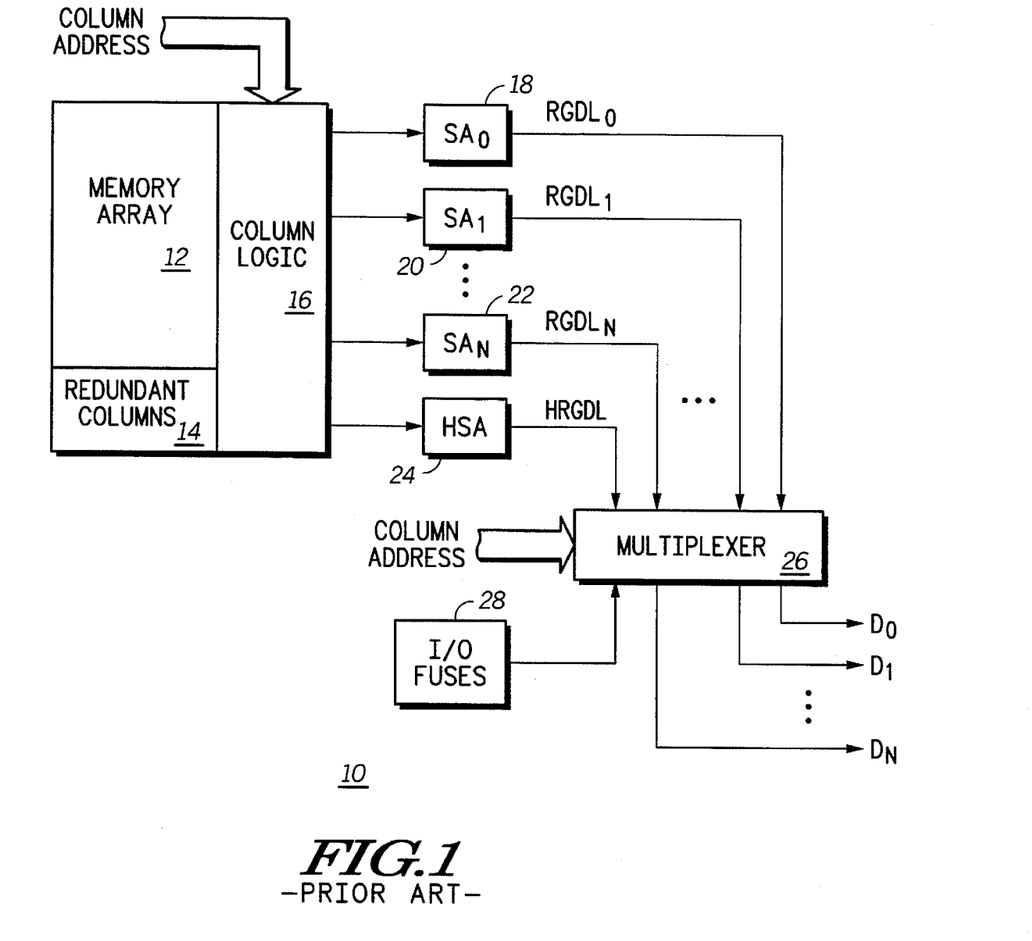
FIG. 1 illustrates, in block diagram form, a read data path of an integrated circuit memory in accordance with the prior art.

FIG. 1 illustrates, in block diagram form, a portion of a read data path of a prior art integrated circuit memory 10. Integrated circuit memory 10 includes memory array 12, redundant columns 14, column decoding 16, a plurality of sense amplifiers including sense amplifiers 18, 20, and 22, redundant sense amplifier 24, data multiplexer 26, and I/O fuses 28. Sense amplifiers 18, 20, and 22 represent N sense amplifiers, where N is an integer. For purposes of clarity and simplicity, circuits such as row decoding circuits and output data circuits are not shown. Memory array 12 may include, for example, a plurality of static random access memory cells. To repair a defective column in integrated circuit memory 10, the defective column is not decoded to one a plurality of read global data lines labeled "RGDL$_0$", "RGDL$_1$", through "RGDL$_N$". Instead, a redundant column is assigned in its place. When a redundant column replaces a defective column of memory array 12, redundant sense amplifier 24 senses and amplifies a differential voltage from redundant columns 14, and provides the amplified differential voltage to a redundant global data line labeled "HRGDL" in FIG. 1. Data from redundant global data line HRGDL is multiplexed to output data circuits with the regular read global data lines RGDL$_0$, RGDL$_1$, and RGDL$_N$ by multiplexer 26 when a redundant column replaces a regular column. I/O fuses 28 are set to indicate which regular read global data line is being replaced. After memory 10 is repaired, when the defective column is addressed, the redundant column is automatically selected in its place invisible to a user.

During a read cycle, data from a redundant column should be provided as quickly as data from a regular column. If data from the redundant column is not provided as fast as data from the regular columns, skewing between the data and, for example, a clock signal may result in incorrect data being read from the memory. As integrated circuit memories become larger, denser, and faster, it becomes more difficult for data from the redundant columns to be provided as fast as data from the regular columns.

DESCRIPTION OF A PREFERRED EMBODIMENT

Generally, the present invention provides an integrated circuit memory having read global data lines that are shared between a regular memory array and a plurality of redundant columns. Data from a redundant multiplexer and regular sense amplifiers is multiplexed onto the read global data lines using a plurality of emitter coupled bipolar transistors. An emitter of each of the emitter coupled bipolar transistors is coupled to a read global data line, and a base is coupled to an output terminal of one the sense amplifiers. When redundant data or regular data is being supplied to the shared read global data lines, the regular sense amplifiers are deselected and the voltage on the bases of the bipolar transistors are reduced to prevent the deselected bipolar transistors from affecting data on the read global data line. A match circuit generates the control signals for selecting the redundant multiplexer and for deselecting the corresponding regular sense amplifier when a redundant column is used instead of a defective column.

The deselect signals are generated faster than the select signals in order to deselect the regular sense amplifiers before the normal data path can be selected. The deselect signals also select the appropriate redundant multiplexer circuit before data is read from the selected redundant column to the redundant sense amplifier. The match circuit uses emitter summing to combine match signals with I/O fuse information to provide the deselect signals very quickly.

By sharing the read global data lines between the regular memory array and the redundant columns, redundant read global data lines are eliminated, thus reducing the surface area required for the integrated circuit memory. Also, a complex multiplexing stage, such as multiplexer 26 illustrated in prior art FIG. 1, is eliminated from the back-end of the integrated circuit memory, providing a faster data path for read data. In addition, the match circuits and the deselect circuits are shared between all of the redundant columns, thus eliminating the need for extra circuitry and for redundant global data lines.

The terms "assert" and "negate" are used when referring to the rendering of a signal, or similar apparatus, into its logically true or logically false state, respectively. If the logically true state is a digital logic level one, the logically false state is a digital logic level zero. And if the logically true state is a digital logic level zero, the logically false state is a digital logic level one. An asterisk (*) after a signal name indicates that the signal is a logical complement of a signal having the same name but lacking the asterisk (*).

Figure 2:
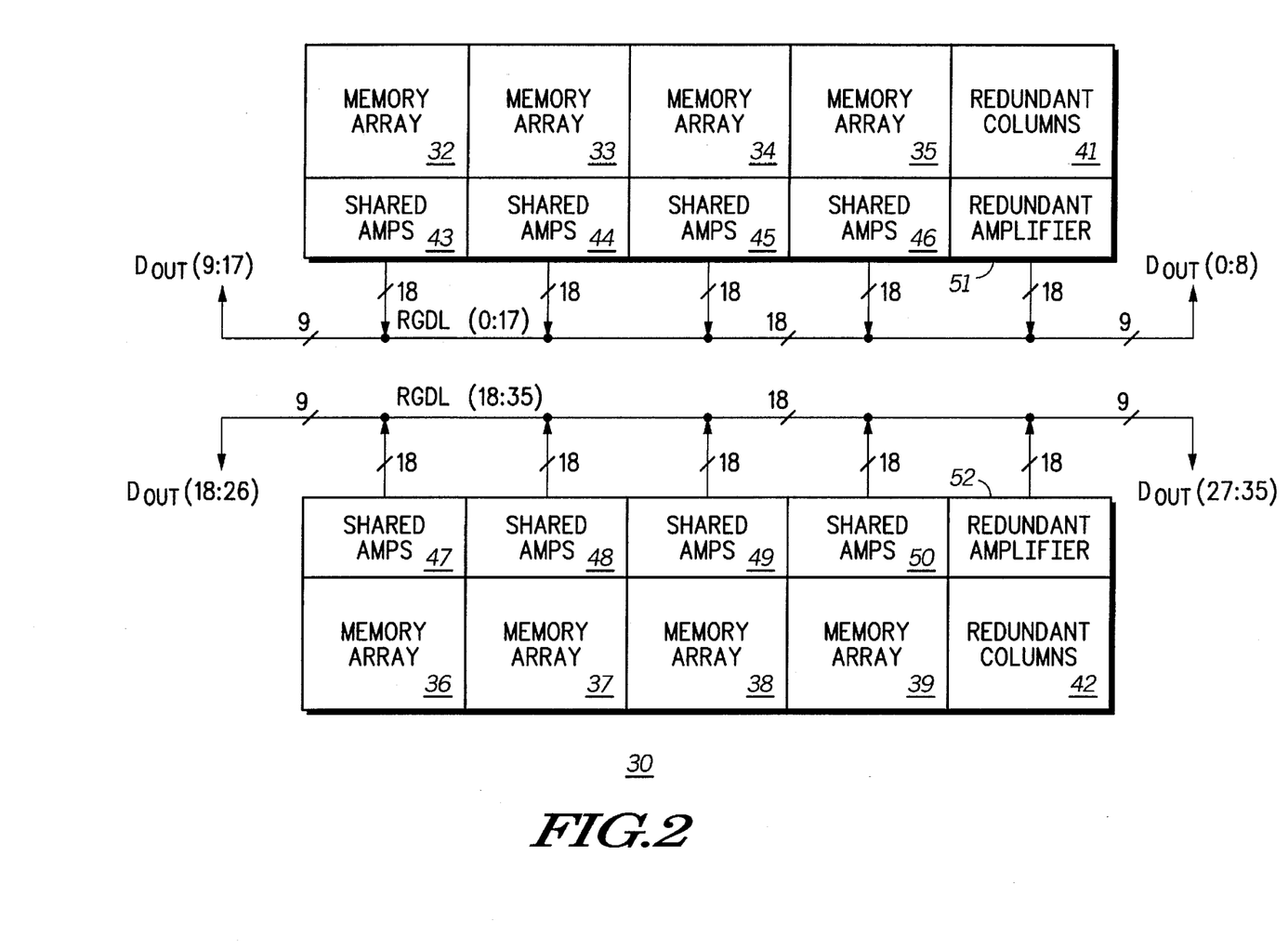
FIG. 2 illustrates, in block diagram form, an integrated circuit memory in accordance with the present invention.

The present invention can be more fully described with reference to FIGS. 2–6. FIG. 2 illustrates, in block diagram form, integrated circuit memory 30 in accordance with the present invention. Integrated circuit memory 30 includes memory arrays 32–39, shared sense amplifiers 43–50, redundant columns 41 and 42, and redundant sense amplifiers 51 and 52. Memory arrays 32–39 are divided into two halves, one half comprising memory arrays 32–35 and the other half comprising memory arrays 36–39. Read global data lines labeled "RGDL(0:17)" and "RGDL(18:35)" are disposed between the two halves for transmitting data signals during a read cycle of integrated circuit memory 30 to output data circuitry (not shown), such as output data buffers, level converters, registers, and pads. Read global data lines RGDL(0:17) are for transmitting data signals from memory arrays 32–35 to data out pads during the read cycle. Read global data lines RGDL(18:35) are for transmitting data signals from memory arrays 36–39 to data out pads during the read cycle. Note that each read global data line in FIG. 2 represents a pair of lines for transmitting a differential data signal. In the illustrated embodiment, integrated circuit memory 30 has a data organization, or word width, of 36 bits. Therefore each of shared sense amplifiers 43–50 includes 18 sense amplifier circuits. During a read cycle, eighteen sense amplifier circuits are enabled from each half of integrated circuit memory 30 in order to provide 36 output data signals labeled "$D_{OUT}(0:35)$" to the output data circuitry.

A redundant column element of redundant columns 41 is used to "replace" a defective column in any of memory arrays 32–35. A redundant column element of redundant columns 42 can replace a defective column in any of memory arrays 36–39. Redundant sense amplifier 51 senses and amplifies differential data signals from the selected redundant column element and provides corresponding data signals to the appropriate read global data line depending on the location of the defective column being replaced in memory arrays 32–35. Likewise, redundant sense amplifier 52 senses and amplifies differential data signals from the selected redundant column of redundant columns 42, and provides corresponding data signals to the appropriate read global data line depending on the location of the defective column of memory arrays 36–39.

Redundant columns 41 are arranged into groups of four contiguous columns. A redundant column element comprises one group of the four contiguous columns. Redundant columns 41 includes four redundant column elements for repairing defects in any of memory arrays 32, 33, 34, and 35. Redundant columns 42 includes four redundant column elements for repairing defects in any of memory arrays 36, 37, 38, and 39. When any defective column is replaced, three other adjacent columns are replaced as well as the identified defective column. In other embodiments, a redundant column element can include more or less than four contiguous columns, and there can be more or less than four redundant column elements in redundant columns 41 and redundant columns 42.

If redundant read global lines were used in integrated circuit memory 30, as shown in prior art FIG. 1, the redundant read global data lines would be added to the 36 regular read global data lines illustrated in FIG. 2, requiring more surface area for integrated circuit memory 30. By sharing the regular read global data lines between regular data and redundant data, the need to route redundant read global data lines across integrated circuit memory 30 is eliminated. This may substantially reduce the amount of surface area required for implementing integrated circuit memory 30. Also, the need for complicated multiplexing at a final buffer stage (back end) of the memory is eliminated.

Figure 3:
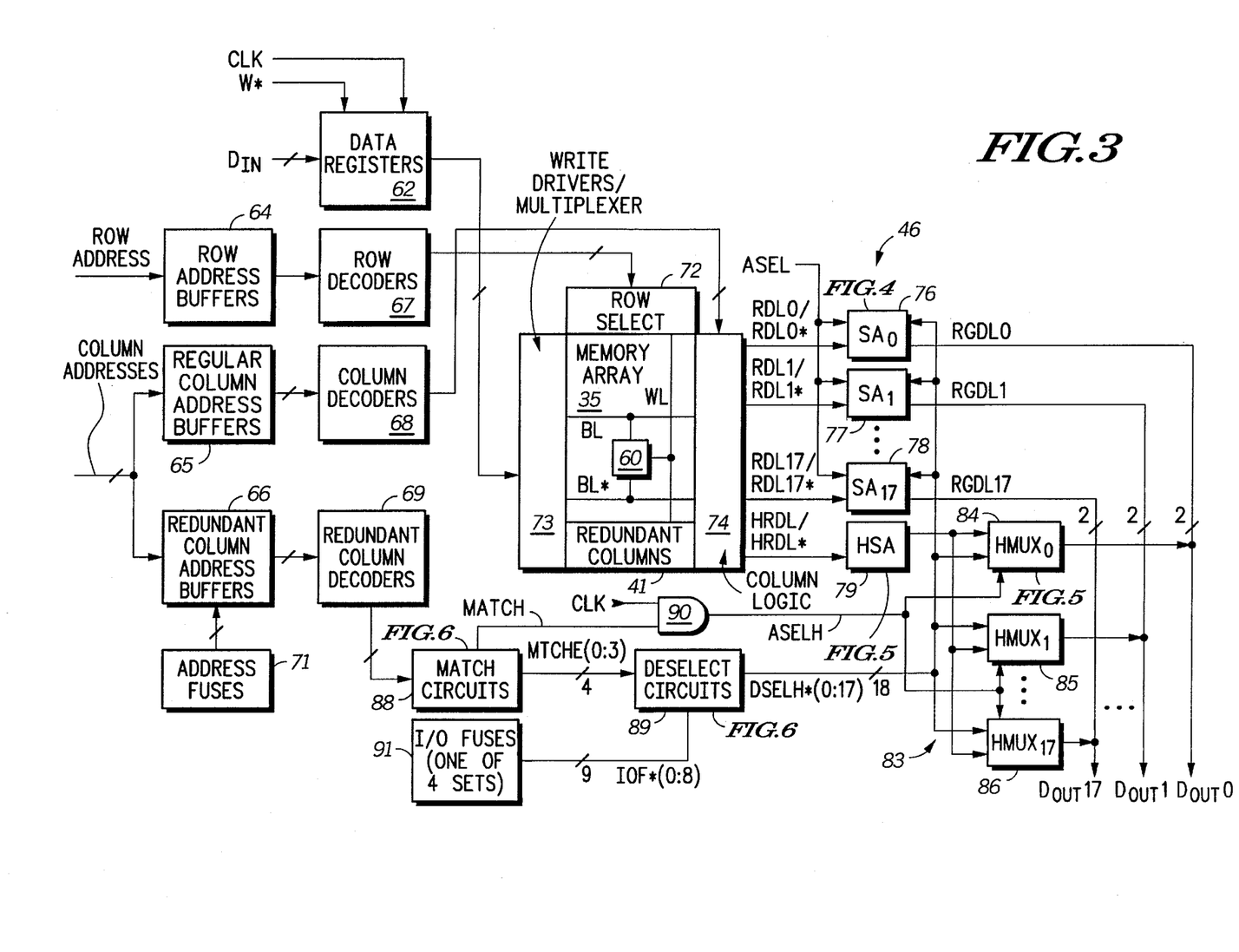
FIG. 3 illustrates, in partial block diagram form and partial logic diagram, a portion of the integrated circuit memory of FIG. 2.

FIG. 3 illustrates, in partial block diagram form and partial logic diagram, a portion of integrated circuit memory 30 of FIG. 2. The portion of integrated circuit memory 30 includes memory array 35, redundant columns 41, data-in registers 62, row address buffers 64, regular column address buffers 65, redundant column address buffers 66, row decoders 67, regular column decoders 68, redundant column decoders 69, row select circuit 72, write drivers/multiplexer 73, column logic 74, address fuses 71, sense amplifiers 46, redundant sense amplifier 79, a multiplexer 83 including redundant multiplexer circuits 84, 85, and 86, match circuits 88, AND logic gate 90, deselect circuits 87, and I/O fuses 91. Sense amplifiers 46 includes a plurality of sense amplifiers represented by sense amplifier 76, sense amplifier 77, and sense amplifier 78. Sense amplifier 76 is illustrated in more detail in FIG. 4.

Memory array 35 is a conventional memory array including a plurality of static random access memory (SRAM) cells organized in a plurality of rows and a plurality of columns. Each memory cell is coupled to a bit line pair and to a word line. A representative memory cell 60 is shown coupled to a bit line pair labeled "BL" and "BL*" and to a word line labeled "WL". A column includes a bit line pair and all of the memory cells coupled to the bit line pair. A row includes a word line and all of the memory cells coupled to the word line.

Row address buffers 64 receive a plurality of row address signals labeled "ROW ADDRESS" and provide a plurality of buffered differential row address signals to row decoder 67. Regular column address buffers 65 receive a plurality of column address signals labeled "COLUMN ADDRESS", and provide a plurality of buffered differential column address signals to regular column decoders 68. Redundant column address buffers 66 also receive column address signals COLUMN ADDRESS, and provide buffered differential column address signals to redundant column decoders 69. Row decoders 67 provide a plurality of decoded row address signals to row select 72. Regular column decoders 68 provide decoded column address signals to column logic 74. In response to receiving the decoded row address signals, row select 72 selects a word line in memory array 35, and column logic 74 selects a bit line pair. A memory cell located at the intersection of the word line and the bit line pair receives a differential data signal via the bit line pair during a write cycle, or provides a differential data to the bit line pair during a read cycle. Note that the particular address signals provided by row decoders 67 and column decoders 68 have no special significance and may be different in other embodiments. Also, the amount of decoding performed by row decoders 67 and regular column decoders 68 is not important for describing the invention and may be different in other embodiments. The selected bit line pair is coupled to an input terminal of a sense amplifier of shared sense amplifiers 46 via column logic 74. Sense amplifier 76 has an input terminal for receiving differential data signals labeled "RDL0/RDL0*", and an output terminal connected to the pair of read global data lines RGDL0. Sense amplifier 77 has an input terminal for receiving differential data signals labeled "RDL1/RDL1*", and an output terminal connected to the pair of read global data lines RGDL1. Sense amplifier 78 has an input terminal for receiving differential data signals labeled "RDL17/RDL17*" and an output terminal connected to the pair of read global data lines RGDL17.

Redundant sense amplifier 79 has an input terminal connected to column logic 74 for receiving redundant differential data signals labeled "HRDL/HRDL*", and an output terminal. Redundant multiplexer circuits 84, 85, and 86 have input terminals connected to the output terminal of redundant sense amplifier 79. Redundant multiplexer circuit 84 has an output terminal connected to read global data line RGDL0, redundant multiplexer circuit 85 has an output terminal connect to read global data line RGDL1, and redundant multiplexer circuit 86 has an output terminal connected to read global data line RGDL17.

In a preferred embodiment, a defective column of integrated circuit memory 30 is repaired by blowing fusible links in address fuses 71 and in I/O fuses 91. I/O fuses 91 function as repair information storage elements and have terminals connected to deselect circuits 89. Fusible links in address fuses 71 are blown to indicate which column address is being replaced with a redundant column. Fusible links in I/O fuses 91 are blown to indicate which redundant multiplexer to enable during a read cycle of integrated circuit memory 30. The fusible links may be blown with, for example, a high-energy laser or blown electrically during probe testing. In other embodiments, other methods for storing address mapping information of repaired and redundant columns may be used, such as by using non-volatile memory. Note that the redundant data path and address mapping for writing data to a redundant column is accomplished using a conventional redundancy technique, is not important for describing the invention, and is therefore not shown.

During a write cycle of repaired integrated circuit memory 30, row address signals ROW ADDRESS are provided to row address buffers 64 and column address signals COLUMN ADDRESS are provided to regular column address buffers 65 and to redundant column data buffers 66. The row and column addresses are used to identify which memory cell is to be over written, if necessary. The incoming column addresses are compared to column addresses stored in address fuses 71. If there is a match, indicating that the column corresponding to the column address has been replaced with a redundant column element, data signals labeled "DIN" are written to a redundant column instead of the regular column.

During a read cycle of repaired integrated circuit memory 30, row address signals ROW ADDRESS are provided to row address buffers 64 and column address signals COLUMN ADDRESS are provided to regular column address buffers 65 and to redundant column data buffers 66. The row and column addresses are used to identify which memory cell is to be read, for example, memory cell 60 of memory array 35. At the same time that the address is being decoded and provided to memory array 35 by row decoders 67 and regular column decoders 68, redundant column decoders 69 are decoding the column address and providing the decoded address to match circuits 88. Note that the column address may also include block address information to determine which block of memory cells to access. Match circuits 88 includes one match circuit for each redundant column element of redundant columns 41. Match circuits 88 has a first output terminal for providing a match signal labeled "MATCH", and 4 additional output terminals for providing match signals labeled "MTCHE(0:3)". Match signal MATCH is derived from match signals MTCHE(0:3). Each of match signals MTCHE(0:3) corresponds to one redundant column element. The number of redundant column elements of redundant columns 41 determines how many match signals MTCHE(0:3) are used.

If a set of redundant columns is used to replace an addressed defective regular column, a logic high match signal MATCH is provided to an input terminal of AND logic gate 90. When clock signal CLK is a logic high, AND logic gate 90 provides a logic high select signal labeled "ASELH" to each of redundant multiplexer circuits 84, 85, and 86 of redundant multiplexer 83. Also, one of match signals MTCHE0, MTCHE1, MTCHE2, or MTCHE3 is provided as a logic high, depending on which set of redundant columns is to replace the defective column. The logic high match signal MTCHE(0:3) is also provided to deselect circuits 87. In response, deselect circuits 87 provide one of 18 deselect signals labeled "DSELH*(0:17)" depending on repair information stored in I/O fuses 91. The deselect signals are used to deselect regular sense amplifiers 46, and to selectively couple one of the 18 redundant multiplexer circuits represented by redundant multiplexer circuits 84, 85, and 86 to its corresponding read global data line. The selected redundant multiplexer circuit provides a data signal from redundant sense amplifier 51 to the corresponding read global data line. The data signal is then provided to the output data circuitry (not shown).

During a read cycle, if the address of a selected memory cell has not been identified as having been repaired, data is provided by memory cell 60 to bit line pair BL/BL*, in the form of a differential voltage between the bit lines of the bit line pair. Column logic 74 couples bit line pair BL/BL* to a sense amplifier of sense amplifiers 46. Sense amplifiers 46 are enabled when control signal ASEL is asserted as a logic high voltage and deselect signals DSELH*(0:17) are all negated as logic high voltages. Select signal ASELH is negated as a logic low to deselect all of redundant multiplexer circuits 84, 85, and 86. One or more of sense amplifiers 46 may be enabled and selectively coupled to a read global data line depending on the data organization of integrated circuit memory 30. However, in the illustrated embodiment, all of 18 sense amplifiers of sense amplifiers 46 are enabled. The enabled sense amplifier senses and amplifies the differential voltage from the selected memory cell and provides the differential voltage via a read global data line as one of output data signals $D_{OUT}(0:17)$. One or more of output data signals $D_{OUT}(0:17)$ are provided to the output data circuitry that correspond to data stored in the selected memory cell.

Since the read global data lines are shared between regular columns and redundant columns, it is important that regular sense amplifiers 46 are deselected before one of more of redundant multiplexer circuits 84, 85, and 86 are selected. This is ensured by using redundant column decoders 69, match circuits 88, and deselect circuits 87 to generate the deselect signals quickly, and to ensure that data from the redundant columns are provided as quickly as data from the regular columns.

Figure 4:
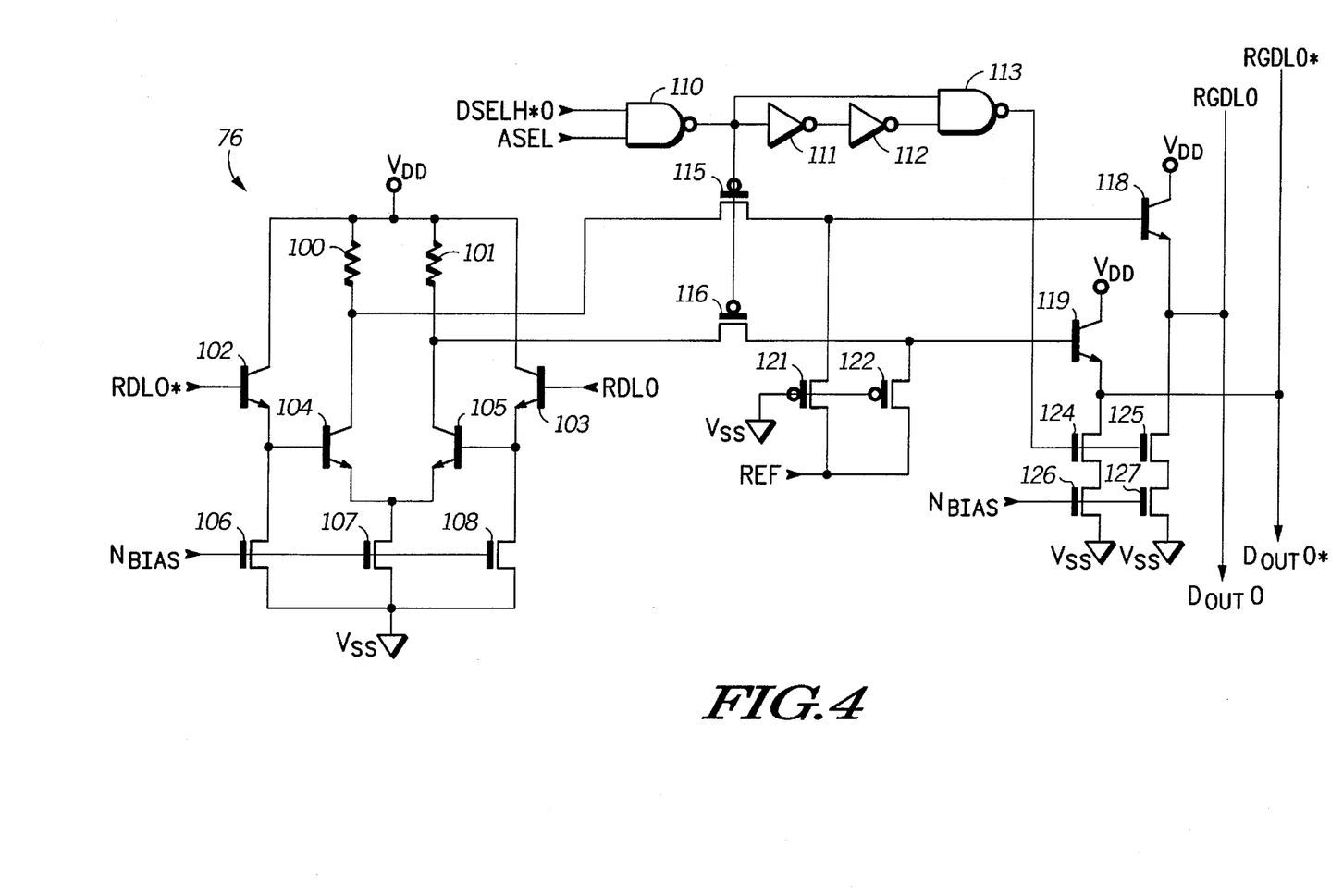
FIG. 4 illustrates, in partial schematic diagram form and partial logic diagram form, a regular sense amplifier of the portion of the integrated circuit memory of FIG. 3.

FIG. 4 illustrates, in partial schematic diagram form and partial logic diagram form, regular sense amplifier 76 of the portion of integrated circuit memory 30 of FIG. 3. Regular sense amplifier 76 includes resistors 100 and 101, NPN bipolar transistors 102, 103, 104, 105, 118, and 119, N-channel transistors 106, 107, 108, 124, 125, 126, and 127, P-channel transistors 115, 116, 121, and 122, NAND logic gates 110 and 113, and inverters 111 and 112. There are 18 sense amplifiers similar to regular sense amplifier 76 in sense amplifiers 46.

Regular sense amplifier 76 includes a conventional differential amplifier having emitter-follower input transistors 102 and 103. The differential amplifier comprises NPN transistors 104 and 105, resistors 100 and 101, and N-channel transistor 107. Collectors of NPN transistors 102 and 103 and terminals of resistors 100 and 101 are connected to a power supply voltage terminal labeled "$V_{DD}$". Emitter-follower output transistors 118 and 119 are connected to output terminals of the differential amplifier through P-channel pass transistors 115 and 116, respectively. N-channel transistors 106, 107, and 108 receive a bias voltage labeled "$N_{BIAS}$" to provide relatively constant current sources for the bipolar transistors. N-channel transistor 106 is coupled between the emitter (current electrode) of NPN transistor 102 and $V_{SS}$ and provides a current source for NPN transistor 102. N-channel transistor 107 is coupled between the emitter of a differential pair comprising NPN transistors 104 and 105, and to $V_{SS}$ and provides a current source for the differential pair. N-channel transistor 108 is coupled between the emitter (current electrode) of NPN transistor 103 and $V_{SS}$ and provides a current source for NPN transistor 103.

P-channel transistors 115 and 116 function as coupling elements between an output terminal of the differential amplifier and a base (control electrode) of bipolar transistors 118 and 119. P-channel transistors 115 and 116 are conductive in response to select signal ASEL being asserted as a logic high and deselect signal DSELH*0 being negated as a logic high. N-channel transistors 124 and 126 are coupled in series between the emitter of NPN transistor 119 and a power supply voltage terminal labeled "$V_{SS}$". A gate of N-channel transistor 124 is connected to the output terminal of NAND logic gate 113, and a gate of N-channel transistor 126 receives bias voltage $N_{BIAS}$. N-channel transistors 124 and 126 provide momentary current sources for NPN transistor 119 in response to a logic high signal from NAND logic gate 113. N-channel transistors 125 and 127 are coupled in series between the emitter of NPN transistor 118 and $V_{SS}$. A gate of N-channel transistor 125 is connected to the output terminal of NAND logic gate 113, and a gate of N-channel transistor 127 receives bias voltage $N_{BIAS}$. N-channel transistors 125 and 127 provide momentary current sources for NPN transistor 118 in response to a logic high signal from NAND logic gate 113. The length of time that the current sources are conductive is determined by a predetermined delay provided by inverters 111 and 112.

During a read cycle of integrated circuit memory 30, differential data signals RDL0* and RDL0 are provided to the bases of NPN transistors 102 and 103, respectively. Differential data signals RDL0* and RDL0 have a relatively small signal swing of approximately 100 millivolts. NPN transistor 104 receives a voltage equal to the voltage of data signal RDL0* minus a base-emitter diode voltage drop ($V_{BE}$) of NPN transistor 102. NPN transistor 105 receives a base voltage equal to the voltage of data signal RDL0 minus a $V_{BE}$ of NPN transistor 103. One $V_{BE}$ is equal to about 0.7 volts. When data signal RDL0 is a logic high voltage and data signal RDL0* is a logic low voltage, a logic low voltage is provided to a current electrode of P-channel transistor 116, and a logic high voltage is provided to a current electrode of P-channel transistor 115. The data signals are passed to the bases of emitter-follower NPN transistors 118 and 119 when select signal ASEL is asserted as a logic high and deselect signal DSELH*0 is negated as a logic high. The gates of N-channel transistors 124 and 125 are momentarily pulsed with a logic high voltage for a predetermined length of time, causing N-channel transistors 124 and 125 to be conductive. A voltage of data signal $D_{OUT}0$ is increased to a logic high voltage and a voltage of data signal $D_{OUT}0^*$ is decreased to a logic low voltage.

When P-channel transistors 115 and 116 are substantially non-conductive, relatively weak P-channel transistors 121 and 122 reduce the voltage on the bases of NPN transistors 118 and 119 to a predetermined voltage determined by a reference voltage labeled "REF" to ensure that NPN transistors 118 and 119 are substantially non-conductive and do not affect signals provided to read global data lines RGDL0 and RGLD0* by another regular sense amplifier or by one of redundant multiplexer circuits 84, 85 or 86 (FIG. 3).

Figure 5:
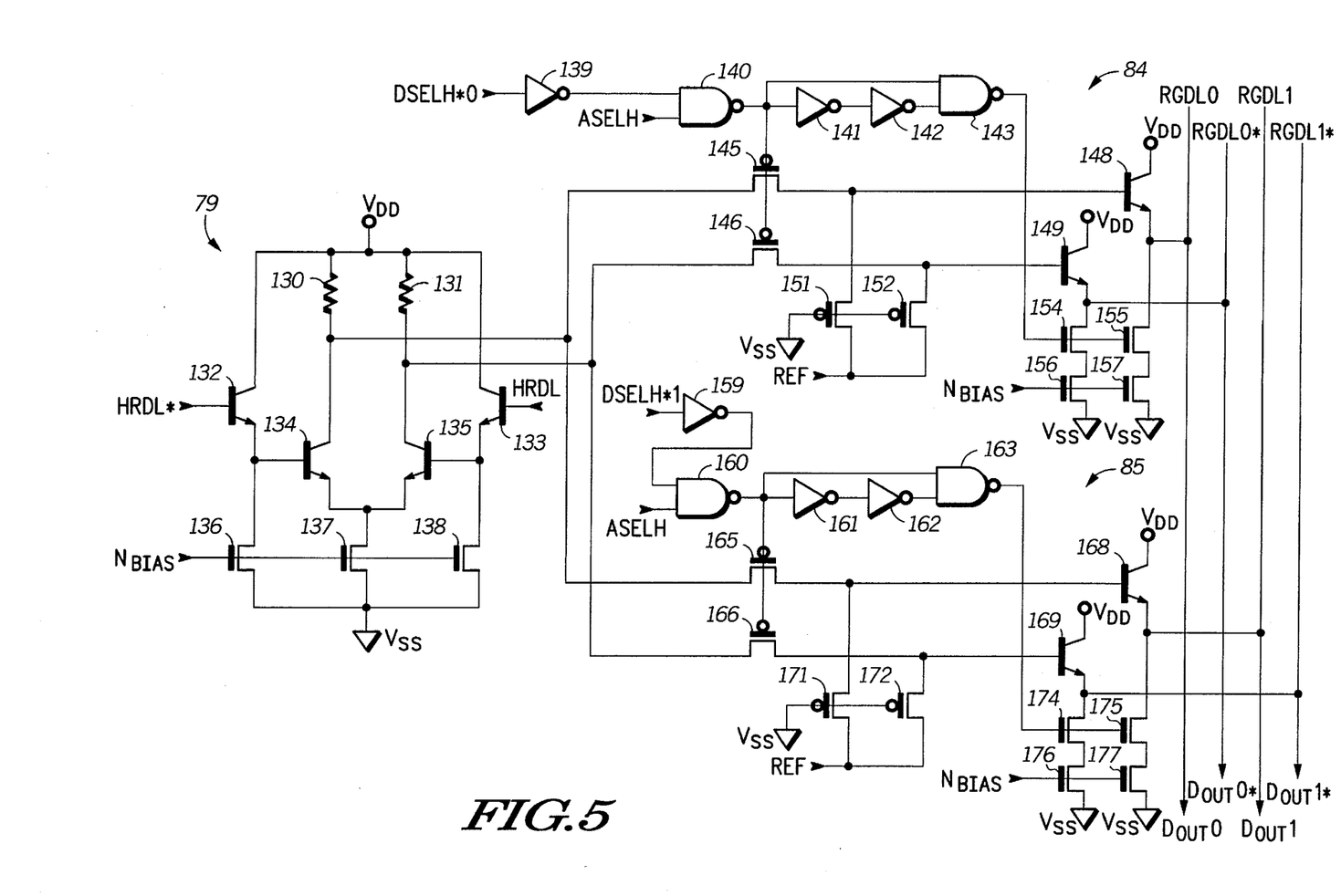
FIG. 5 illustrates, in partial schematic diagram form and partial logic diagram form, a redundant sense amplifier of the portion of the integrated circuit memory of FIG. 3.

FIG. 5 illustrates, in partial schematic diagram form and partial logic diagram form, redundant sense amplifier 79, and redundant multiplexer circuits 84 and 85 of the portion of integrated circuit memory 30 of FIG. 3.

Redundant sense amplifier 79 includes resistors 130 and 131, NPN bipolar transistors 132, 133, 134, and 135, and N-channel transistors 136, 137, and 138. Redundant multiplexer circuit 84 includes inverters 139, 141, and 142, NAND logic gates 140 and 143, P-channel transistors 145, 146, 151, and 152, NPN bipolar transistors 148 and 149, and N-channel transistors 154, 155, 156, and 157. Redundant multiplexer circuit 85 includes inverters 159, 161, and 162, NAND logic gates 160 and 163, P-channel transistors 165, 166, 171, and 172, NPN bipolar transistors 168 and 169, and N-channel transistors 174, 175, 176, and 177.

Redundant sense amplifier 79 includes a conventional differential amplifier having emitter-follower input transistors 132 and 133. The differential amplifier comprises NPN transistors 134 and 135, resistors 130 and 131, and N-channel transistor 137. Emitter-follower output transistors 148 and 149 of redundant multiplexer 84 are coupled to output terminals of the differential amplifier through P-channel pass transistors 145 and 146, respectively. Pass transistors 145 and 146 are function as coupling elements for coupling the output terminal of redundant sense amplifier 79 to the base of an emitter-follower bipolar transistor. Emitter-follower output transistors 168 and 169 of redundant multiplexer 85 are coupled to output terminals of the differential amplifier through P-channel pass transistors 165 and 166, respectively. The emitter-follower output transistors each have a collector connected to $V_{DD}$, a base connected to an output terminal of a coupling element, an emitter connected to a read global data line. N-channel transistors 136, 137, and 138 receive bias voltage $N_{BIAS}$ and provide relatively constant current sources. N-channel transistor 136 provides a current source for NPN transistor 132. N-channel transistor 137 provides a current source for the differential amplifier having NPN transistors 134 and 135. N-channel transistor 138 provides a current source for NPN transistor 133. P-channel pass transistors 145 and 146 are conductive in response to deselect signal DSELH*0 being asserted as a logic low and select signal ASELH being asserted as a logic high. N-channel transistors 154 and 156 provide a momentary current source for the emitter of NPN transistor 149 in response to a logic high pulse of a predetermined duration from NAND logic gate 143. N-channel transistors 155 and 157 provide a momentary current source for the emitter of NPN transistor 148 in response to a logic high pulse of the predetermined duration from NAND logic gate 143. The length of time that current sources are conductive is determined by a delay provided by inverters 141 and 142. Likewise, P-channel pass transistors 165 and 166 of redundant multiplexer 85 are conductive in response to select signal ASELH being asserted as a logic high and deselect signal DSELH*1 being asserted as a logic low. N-channel transistors 174 and 176 provide momentary current sources for the emitter of NPN transistor 169 in response to a logic high pulse from NAND logic gate 163. N-channel transistors 175 and 177 provide momentary current sources for the emitter of NPN transistor 168 in response to the logic high pulse from NAND logic gate 163. The length of time that current sources are conductive is determined by a delay provided by inverters 161 and 162.

P-channel-transistors 145 and 146 function as coupling elements between the output terminals of the differential amplifier and the bases of bipolar transistors 148 and 149. When P-channel transistors 145 and 146 of redundant multiplexer circuit 84 are substantially non-conductive, relatively weak P-channel transistors 151 and 152 reduce the voltage on the bases of NPN transistors 148 and 149 to a predetermined voltage determined by reference voltage REF to ensure that NPN transistors 148 and 149 are substantially non-conductive. P-channel transistors 171 and 172 reduce a voltage at the bases of NPN transistors 168 and 169, respectively, to the predetermined voltage when P-channel pass transistors 165 and 166 are substantially non-conductive.

During a read cycle, redundant sense amplifier 79 functions the same as regular sense amplifier 76. Only one of the 18 redundant multiplexer circuits, represented by redundant multiplexer circuits 84, 85, and 86 (FIG. 3), that comprises redundant multiplexer 83, are coupled to redundant sense amplifier 51 and can be active at the same time.

Figure 6:
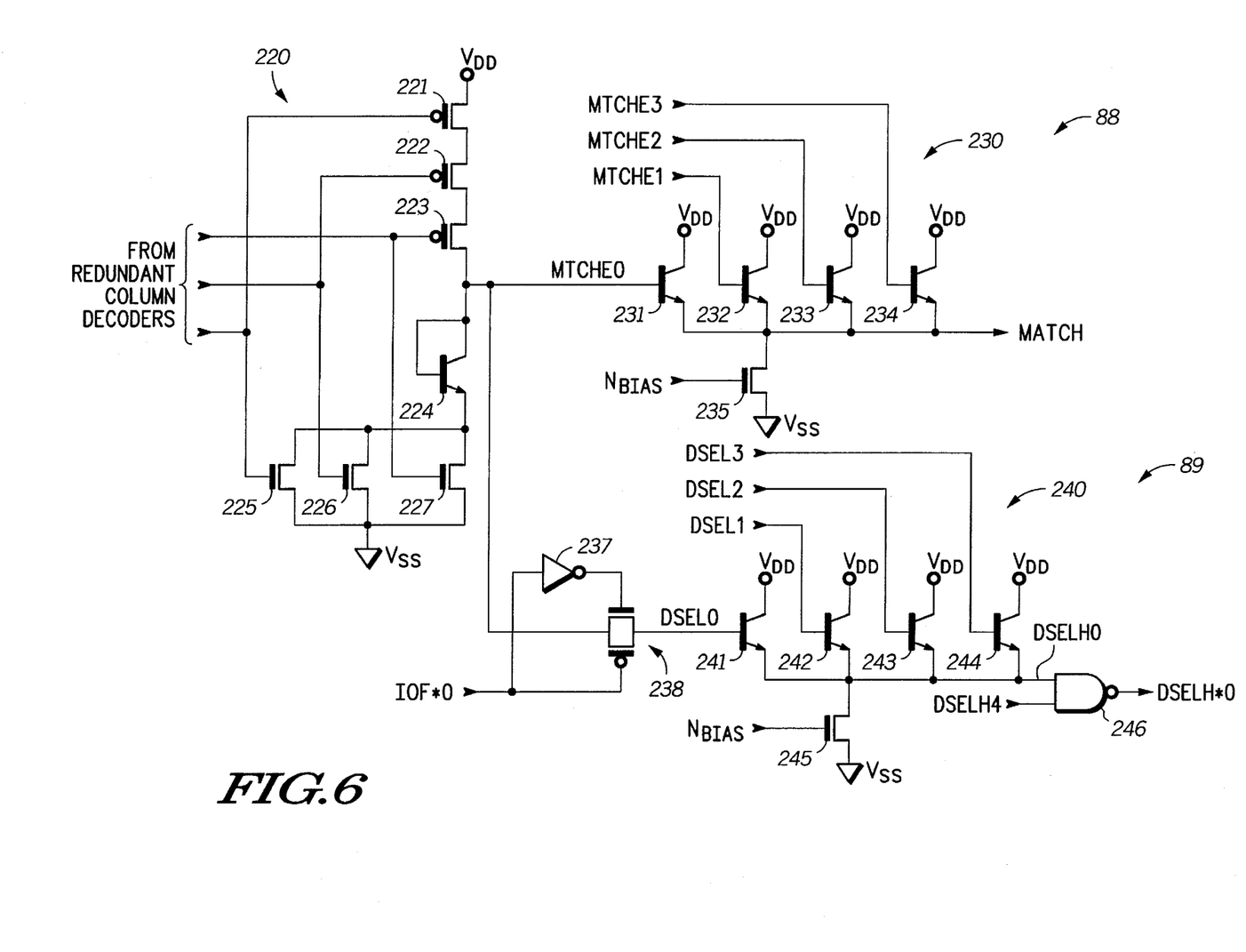
FIG. 6 illustrates, in partial schematic diagram form and partial logic diagram form, a match circuit and a deselect circuit of the portion of the integrated circuit memory of FIG. 3.

FIG. 6 illustrates, in partial schematic diagram form and partial logic diagram form, match circuit 88 and deselect circuit 89 of the portion of integrated circuit memory 30 of FIG. 3. Deselect circuit 89 is one of 9 deselect circuits 87 of FIG. 3. Match circuit 88 includes NOR logic gate 220 and emitter summing circuit 230. NOR logic gate 220 includes P-channel conductivity type transistors 221, 222, and 223, NPN bipolar transistor 224, and a plurality of parallel connected N-channel conductivity type transistors 225, 226, and 227. Emitter summing circuit 230 includes NPN transistors 231, 232, 233, and 234, and N-channel transistor 235. Deselect circuit 89 includes inverter 237, transmission gate 238, and emitter summing circuit 240. Emitter summing circuit 240 includes NPN transistors 241, 242, 243, and 244, N-channel transistor 245, and NAND logic gate 246.

In NOR logic gate 220, P-channel transistors 221, 222, and 223 represent a plurality of series-connected transistors and have control electrodes (gates) for receiving decoded address signals from redundant column decoders 69 (FIG. 3). N-channel transistors 225, 226, and 227 are connected in parallel and have control electrodes coupled to the control electrodes of the P-channel transistors 221, 222, and 223. Diode-connected NPN transistor 224 is coupled at an output terminal of NOR logic gate 220 between the P-channel transistors the N-channel transistors. In response to receiving address information from redundant column decoders 69, the output terminal of NOR logic gate 220 provides a match signal labeled "MTCHE 0". Match signal MTCHE 0 is provided to the base of NPN transistor 231 having a relatively large signal swing. A logic high logic level is about one $V_{BE}$ below $V_{DD}$, and a logic low is at zero volts or ground potential. A power supply voltage of about 3.3 volts is provided to $V_{DD}$, and $V_{SS}$ is coupled to ground. Diode-connected NPN transistor 224 is used to clamp the base of each bipolar transistor 231, 232, 233, and 234, at a $V_{BE}$ above ground to provide some reverse bias protection for the base-emitter junctions.

There is a NOR logic gate similar to NOR logic gate 220 for each redundant column element in redundant columns 41. The NOR logic gates are used for providing each of the other match signals labeled "MTCHE 1", "MTCHE 2", and "MTCHE 3". If all of the input terminals of NOR logic gate 220 are a logic low, indicating that the redundant column element of redundant columns 41 corresponding to NOR logic gate 220 is being used to replace a defective column, then match signal MTCHE 0 is provided to the base of NPN transistor 231 as a logic high voltage. NPN transistor 231 provides a logic high match signal MATCH to AND logic gate 90. Match signal MATCH and clock signal CLK are used to enable the appropriate redundant multiplexer circuit 84, 85, through 86. Only one of match signals MTCHE 0, MTCHE 1, MTCHE 2, and MTCHE 3 can be a logic high at the same time. If any of match signals MTCHE 0, MTCHE 1, MTCHE 2, and MTCHE 3 is a logic high, match signal MATCH will be asserted as a logic high. Also, the logic high match signal MTCHE 0 is provided to deselect circuits 89. There are four sets of nine deselect circuits similar to deselect circuits 89. I/O fuse information from I/O fuses 91 is combined with signals from the nine deselect circuits 89 to generate nine deselect signals DSELH(0:8). Deselect signals DSELH(0:8) are combined together using NAND logic gates, such as NAND logic gate 246, for example, to generate the 18 deselect signals DESELH*(0:17). Therefore, each set of I/O fuses 91 provides nine fuse signals IOF*(0:8), which are combined with each match signals MTCHE 0, MTCHE 1, MTCHE 2, and MTCHE 3 to provide a one of 18 replacement of a regular sense amplifier with a redundant multiplexer. For example, deselect circuit 89 provides a logic low deselect signal labeled "DSELH* 0" to disable regular sense amplifier 76 and enable redundant multiplexer 84 in response to receiving a logic high match signal MTCHE 0 and a logic low fuse signal labeled "IOF* 0" in the event that a set of redundant columns is used to replace a defective column using that particular output path.

By providing match signals MTCHE 0, MTCHE 1, MTCHE 2, and MTCHE 3 to emitter summing circuit 230 having a relatively large signal swing, NPN transistors 231–234 can drive match signal MATCH at CMOS (complementary metal-oxide semiconductor) logic levels. Providing signals having a relatively large signal swing to emitter summing circuit 230 is possible without severely reverse-biasing emitter-coupled NPN transistors 231–234 because a lower power supply voltage is used (for example, 3.3 volts is used instead of 5.0 volts). The use of emitter summing circuit 230 to generate match signal MATCH provides relatively small gate delays as compared to a conventional CMOS logic circuit for providing the same function.

The use of redundant column decoders and emitter summing in the match circuits ensures that the control signals for deselecting a regular column and for selecting a redundant column occurs quickly enough to allow the read global data lines to be shared between the redundant columns and the regular columns. Also, since redundant read global data lines are not needed, a multiplexing stage is eliminated, increasing the speed of the integrated circuit memory.

While the invention has been described in the context of a preferred embodiment, it will be apparent to those skilled in the art that the present invention may be modified in numerous ways and may assume many embodiments other than that specifically set out and described above. For example, in the illustrated embodiment, integrated circuit memory 30 is described as comprising SRAM cells. However, in other embodiments, integrated circuit memory 30 may comprise dynamic random access memory (DRAM) cells, electrically erasable programmable random access memory (EEPROM) cells, or another type of volatile or nonvolatile memory cells. Accordingly, it is intended by the appended claims to cover all modifications of the invention which fall within the true spirit and scope of the invention.

What is claimed is:

1. An integrated circuit memory, comprising:

a memory array having a plurality of memory cells organized in a plurality of rows and a plurality of columns;

a redundant column of memory cells; and a read global data line, selectively coupled to either a column of the plurality of columns or the redundant column of memory cells, the redundant column of memory cells for replacing a defective column of the plurality of columns;

wherein either a regular data signal corresponding to data from the column of the plurality of memory cells and a redundant data signal corresponding to data from the redundant column are emitter summed onto the read global data line.

2. The integrated circuit memory of claim 1, wherein the memory array is characterized as being an array of static random access memory cells.

3. The integrated circuit memory of claim 1, further comprising:

a regular sense amplifier having an input terminal coupled to the column of the plurality of columns, and an output terminal selectively coupled to the read global data line;

a redundant sense amplifier having an input terminal coupled to the redundant column, and an output terminal; and a redundant multiplexer having an input-terminal coupled to the output terminal of the redundant sense amplifier, and an output terminal selectively coupled to the read global data line in response to a select signal.

4. The integrated circuit memory of claim 3, the redundant multiplexer comprises a plurality of redundant multiplexer circuits, a redundant multiplexer circuit of the plurality of redundant multiplexer circuits being selectively coupled to the output terminal of the redundant sense amplifier in response to the select signal.

5. The integrated circuit memory of claim 4, wherein either the redundant data signal from the redundant multiplexer and the regular data signal from the regular sense amplifier are emitter summed onto the read global data line.

6. The integrated circuit memory of claim 5, further comprising a plurality of redundant columns, each redundant column of the plurality of redundant columns coupled to the redundant sense amplifier.

7. The integrated circuit memory of claim 6, further comprising:

a plurality of logic gates, a logic gate of the plurality of logic gates corresponding to a redundant column of the plurality of redundant columns, each logic gate having a plurality of input terminals for receiving address information, and an output terminal, the plurality of logic gates for providing a plurality of match signals;

a first emitter summing circuit having a plurality of bipolar transistors, each bipolar transistor having a base coupled to an output terminal of one of the plurality of logic gates, for providing an emitter-summed match signal in response to receiving a match signal of the plurality of match signals;

a repair storage element coupled to the base of each bipolar transistor of the first emitter summing circuit, the repair storage element for storing repair information; and a second emitter summing circuit having a plurality of bipolar transistors, each bipolar transistor of the plurality of bipolar transistors having a base coupled to the repair storage element, and having emitters coupled together.

8. The integrated circuit memory of claim 7, wherein the plurality of match signals having a relatively large signal swing.

9. The integrated circuit memory of claim 7, wherein a logic gate of the plurality of logic gates comprises:

a plurality of series-connected transistors of a first conductivity type having control electrodes for receiving a plurality of address signals;

a plurality of parallel-connected transistors of a second conductivity type having control electrodes coupled to the control electrodes of the plurality of series-connected transistors for receiving the plurality of address signals; and a diode-connected bipolar transistor having a first terminal coupled to the plurality of series-connected transistors, and a second terminal coupled to the plurality of parallel-connected transistors, the diode-connected transistors for providing reverse-bias protection for the plurality of bipolar transistors of the first emitter summing circuit.

10. An integrated circuit memory, comprising:

a memory array having a plurality of memory cells organized in a plurality of rows and a plurality of columns;

a plurality of redundant columns;

a redundant sense amplifier having an input terminal coupled to the plurality of redundant columns, and an output terminal;

a redundant multiplexer having a plurality of redundant multiplexer circuits, each of the plurality of redundant multiplexer circuits having an input terminal coupled to the output terminal of the redundant sense amplifier and an output terminal for providing a redundant data signal corresponding to data from one of the plurality of redundant columns; and a plurality of read global data lines, selectively coupled to either a column of the plurality of columns or to one of the plurality of redundant multiplexer circuits, the plurality of redundant columns for replacing a defective column of the plurality of columns;

wherein either a regular data signal corresponding to data from the plurality of columns and the redundant data signal are emitter summed onto one of the plurality of read global data lines.

11. The integrated circuit memory of claim 10, wherein the plurality of memory cells comprise a plurality of static random access memory cells.

12. The integrated circuit memory of claim 10, wherein each of the plurality of redundant multiplexer circuits comprises:

a coupling element having an input terminal coupled to the output terminal of the redundant sense amplifier, and an output terminal, the coupling element responsive to a match signal; and a bipolar transistor having a first current electrode coupled to a first power supply voltage terminal, a control electrode coupled to the output terminal of the coupling element, and a second current electrode coupled to one of the plurality of read global data lines.

13. The integrated circuit memory of claim 12, further comprising:

a plurality of logic gates, each logic gate of the plurality of logic gates having a plurality of input terminals for receiving address information, and an output terminal;

a first emitter summing circuit having a first plurality of bipolar transistors, a base of each of the first plurality of bipolar transistors coupled to a corresponding output terminal of one of the plurality of logic gates, an emitter of each of the first plurality of bipolar transistors coupled together for providing the match signal;

a repair storage element coupled to the base of each of the first plurality of bipolar transistors of the first emitter summing circuit, the repair storage element for storing repair information for a redundant column of the plurality of redundant columns; and a second emitter summing circuit having a second plurality of bipolar transistors, each bipolar transistor of the second plurality of bipolar transistors having a base coupled to the repair storage element, and having emitters coupled together for providing a deselect signal, the deselect signal for deselecting a defective one of the plurality of columns.

14. The integrated circuit memory of claim 13, wherein a logic gate of the plurality of logic gates comprises:

a plurality of series-connected transistors of a first conductivity type having control electrodes for receiving a plurality of address signals;

a plurality of parallel-connected transistors of a second conductivity type having control electrodes coupled to the control electrodes of the plurality of series-connected transistors for receiving the plurality of address signals; and a diode-connected bipolar transistor having a first terminal coupled to the plurality of series-connected transistors, and a second terminal coupled to the plurality of parallel-connected transistors, the diode-connected bipolar transistor for providing reverse-bias protection for the first plurality of bipolar transistors of the first emitter summing circuit.

15. An integrated circuit memory having shared read global data lines, comprising:

a memory array having a plurality of memory cells organized in a plurality of rows and a plurality of regular columns;

a plurality of redundant columns;

a regular sense amplifier, comprising:
 a differential amplifier having an input terminal coupled to one of the plurality of regular columns, and an output terminal;
 a first coupling element having an input terminal coupled to the output terminal of the differential amplifier, and an output terminal, the first coupling element responsive to a match signal; and
 a first bipolar transistor having a first current electrode coupled to a first power supply voltage terminal, a control electrode coupled to the output terminal of the first coupling element, and a second current electrode;

a redundant sense amplifier, coupled to the plurality of redundant columns, for receiving a data signal from a selected memory cell of a redundant column of the plurality of redundant columns;

a redundant multiplexer having a plurality of redundant multiplexer circuits, each of the plurality of redundant multiplexer circuits comprising:
 a second coupling element having an input terminal coupled to the redundant sense amplifier, and an output terminal, the second coupling element responsive to the match signal; and
 a second bipolar transistor having a first current electrode coupled to the first power supply voltage terminal, a control electrode coupled to the output terminal of the second coupling element, and a second current electrode; and a plurality of shared read global data lines, a read global data line of the plurality of shared read global data lines coupled to the second current electrode of the first bipolar transistor and to the second current electrode of the second bipolar transistor.

16. The integrated circuit memory of claim 15, wherein the plurality of memory cells comprise a plurality of static random access memory cells.

17. The integrated circuit memory of claim 15, further comprising:

a plurality of logic gates, each logic gate of the plurality of logic gates having a plurality of input terminals for receiving address information, and an output terminal;

a first emitter summing circuit having a first plurality of bipolar transistors, a base of each of the first plurality of bipolar transistors coupled to a corresponding output terminal of one of the plurality of logic gates, an emitter of each of the first plurality of bipolar transistors coupled together for providing the match signal;

a repair storage element coupled to the base of each of the plurality of bipolar transistors of the first emitter summing circuit, the repair storage element for storing repair information for a redundant column of the plurality of redundant columns; and a second emitter summing circuit having a second plurality of bipolar transistors, each bipolar transistor of the second plurality of bipolar transistors having a base coupled to the repair storage element, and having emitters coupled together for providing a deselect signal, the deselect signal for deselecting a defective one of the plurality of regular columns.

18. The integrated circuit memory of claim 17, wherein a logic gate of the plurality of logic gates comprises:

a plurality of series-connected transistors of a first conductivity type having control electrodes for receiving a plurality of address signals;

a plurality of parallel-connected transistors of a second conductivity type having control electrodes coupled to the control electrodes of the plurality of series-connected transistors for receiving the plurality of address signals; and a diode-connected bipolar transistor having a first terminal coupled to the plurality of series-connected transistors, and a second terminal coupled to the plurality of parallel-connected transistors, the diode-connected bipolar transistor for providing reverse-bias protection for the first plurality of bipolar transistors of the first emitter summing circuit.

19. The integrated circuit memory of claim 17, wherein the base of each of the first plurality of bipolar transistors receives a logic signal from the output terminal of one of the plurality of logic gates, the logic signal having a relatively large signal swing.

20. The integrated circuit memory of claim 17, wherein the address information is provided by a redundant column decoder.

21. The integrated circuit memory of claim 15, wherein the redundant sense amplifier comprises a differential amplifier having an input terminal for being selectively coupled to one of the plurality of redundant columns, and an output terminal coupled to the input terminal of the second coupling element.

22. The integrated circuit memory of claim 15, further comprising a third transistor having a first current electrode coupled to the control electrode of the first bipolar transistor, a control electrode coupled to a second power supply voltage terminal, and a second current electrode for receiving a reference voltage, the third transistor for reducing a voltage on the control electrode of the first bipolar transistor when the first coupling element is substantially non-conductive.

* * * * *